United States Patent [19]

Fayet et al.

[11] Patent Number: 5,531,060
[45] Date of Patent: Jul. 2, 1996

[54] METHOD OF PRODUCING INTERIORLY STERILE PACKAGES POSSESSING SUPERIOR BARRIER PROPERTIES

[75] Inventors: Pierre Fayet, Lausanne; Bertrand Jaccoud, Siviriez, both of Switzerland

[73] Assignee: Tetra Laval Holdings & Finance SA, Pully, Switzerland

[21] Appl. No.: 383,319

[22] Filed: Feb. 3, 1995

[30] Foreign Application Priority Data

Feb. 4, 1994 [CH] Switzerland .............. 00327/94

[51] Int. Cl.$^6$ .................................. B65B 55/04
[52] U.S. Cl. .................. 53/426; 53/401; 53/452; 53/561; 264/525; 427/574
[58] Field of Search .............. 53/452, 561, 426, 53/402, 401; 427/574, 238, 230; 264/525, 500

[56] References Cited

U.S. PATENT DOCUMENTS

| | | | |
|---|---|---|---|
| 3,442,686 | 5/1969 | Jones | 117/70 |
| 3,808,027 | 4/1974 | Anderson et al. | |
| 4,040,233 | 8/1977 | Valyi | 53/561 |
| 4,363,840 | 12/1982 | Roullet et al. | 427/230 X |
| 4,552,791 | 11/1985 | Hahn | 428/35 |
| 4,612,245 | 9/1986 | Mueller et al. | 427/230 X |
| 4,764,405 | 8/1988 | Bauman et al. | 427/230 X |
| 4,888,199 | 12/1989 | Felts et al. | 427/10 |
| 5,096,738 | 3/1992 | Wyman | 427/44 |
| 5,100,720 | 3/1992 | Sawada et al. | 428/215 |
| 5,122,410 | 6/1992 | Löfgren et al. | 428/216 |
| 5,224,441 | 7/1993 | Felts et al. | 118/718 |
| 5,340,621 | 8/1994 | Matsumoto et al. | 427/571 |
| 5,468,520 | 11/1995 | Williams et al. | 427/574 X |

FOREIGN PATENT DOCUMENTS

| | | |
|---|---|---|
| 0240571 | 10/1987 | European Pat. Off. |
| 0469926 | 2/1992 | European Pat. Off. |
| 63-88938 | 6/1988 | Japan |
| 3-289263 | 4/1993 | Japan |

*Primary Examiner*—James F. Coan
*Attorney, Agent, or Firm*—Burns, Doane, Swecker & Mathis

[57] ABSTRACT

A method of producing an interiorly sterile package possessing superior barrier properties, in which method a package is produced by blow moulding by means of gaseous blow moulding medium, whereafter the blow-moulded package is provided on its inner walls with a coating of a silicon compound by vacuum deposition, the coating acting as a barrier. According to one preferred embodiment of the method, the vacuum deposition is carried out in accordance with conventional chemical plasma deposition by means of a process gas which is identical with the gaseous blow moulding medium employed in the blow moulding operation. As gaseous blow moulding medium and process gas, respectively, use is made of a gas mixture containing oxygen gas and vaporized organic silicon compound, the mixing ratio between the gas components being controlled in such a manner that the coating which is formed in the chemical plasma deposition process consists of a silicon oxide of the general chemical formula $SiO_x$, where x may vary from between 1,8 and 2,2. The chemical plasma deposition is discontinued when the produced coating has achieved a thickness of less than 2000 Å.

20 Claims, No Drawings

METHOD OF PRODUCING INTERIORLY STERILE PACKAGES POSSESSING SUPERIOR BARRIER PROPERTIES

TECHNICAL FIELD

The present invention relates to a method of producing interiorly sterile plastic packages possessing superior gas and aroma barrier properties.

BACKGROUND ART

These days, foods are most generally packed and transported in finished portion or consumer packages of a single-use nature, i.e. packages which are intended to be used only once and thereafter destroyed or taken care of for other uses. Examples of such so-called single-use disposable packages are standard milk or juice packages of plastic coated paper which, after their contemplated use, are either incinerated or taken care of for material recycling or energy recovery at a plant for waste management. Other well-known examples of such portion or consumer packages are normal bottles of plastic or glass of the multi-use returnable type, for example packages which are intended to be used numerous times for the same purpose before being finally destroyed.

Irrespective of whether the package is of one or the other type, i.e. the single-use or multi-use package, the demands placed on it are that it must be easy to produce and handle and that it must be designed and constructed so as to afford the best possible protection to the product which is to be packed and transported in it. The good product protection implies, among other things, that the package must be of sufficient mechanical strength and configurational stability to withstand the outer forces to which the package may be subjected under normal handling, without being deformed or rupturing, and that the package must, moreover, be of sufficient physical and chemical tightness to prevent migration of liquid and/or gases through the package walls. In many cases, it is also required that the package be designed so as to permit aseptic packing of a product which is sterilized and packed under sterile conditions in a likewise sterilized package which, after filling, is sealed in such a manner that the packed product is not reinfected by harmful micro-organisms during its storage prior to consumption.

Generally, good product protection is achieved by a suitable selection of packaging material which, in itself, must be mechanically strong and configurationally stable and rigid and possess physical and chemical tightness properties so as to make possible the production of a configurationally stable package with the desired tightness properties for the product in question. Therefore, the material in the above-mentioned prior art single-use packages most usually consists of numerous layers of material which together impart to the package the desired properties. Thus, a known packaging material comprises a base or core layer of paper or cardboard which imparts to the package mechanical strength and configurational stability, as well as outer layers of polyethylene which make the package liquid-tight. In order to complement the package with tightness properties in respect of gases and other substances, the packaging material is provided with at least one further layer of a material of the desired tightness properties, for example aluminium or a barrier polymer.

For reasons which will be immediately apparent, the packaging material of the described laminated type is complex in its construction and composition which, consequently, becomes more complex the greater and more sophisticated the demands placed on the finished package in order to achieve optimum protection for the product which is to be packed.

Granted, the packaging material in packages of a multi-use nature, eg. glass or plastic bottles is simpler than the above-described packaging material of the laminate type, i.e. they generally consist of only one or possibly two material layers but, on the other hand, it is simultaneously required that the selected material satisfy all mechanical, physical and chemical demands which are placed on the package in order to provide optimum protection to the packed product. In itself, glass possesses good tightness properties against gases and is, moreover, a material possessing superior aroma barrier properties at the same time as it is configurationally stable—but the problem with packages of glass is that they are extremely sensitive to impact and jolts and, therefore, require extra care in order not to be damaged while being handled. Moreover, packages of glass are, as a rule, heavy—which makes their handling even more difficult.

Another material which is often employed in packages of the multi-use type is plastic which is lighter and less sensitive to impact and jolts than glass and, as a result, makes possible the production of more easily handleable packages. The problem inherent in known multi-use packages of plastic is, however, that they require plastics of special types and qualities in order to impart to the finished package the desired barrier properties and, moreover, the selected plastics must be of such a nature as to be well-suited for contact with foods.

OBJECTS OF THE INVENTION

One object of the present invention is, therefore, to obviate the problems and drawbacks inherent in the above-discussed prior art technology.

A further object of the present invention is to devise a package of the type described by way of introduction without associated problems and inconveniences of the type from which the prior art packages suffer.

Yet a further object of the present invention is to devise a package of plastic which possesses excellent tightness properties in respect of both liquids and gases and with excellent aroma barrier properties, without the need for plastics of a particular type or quality as is the case in the prior art technology.

Still a further object of the present invention is to devise a readily produced and easily handled package of plastic which is extremely well-suited for aseptic packing of a product.

SOLUTION

These and other objects will be attained according to the present invention by means of the method defined and characterized in appended claim 1.

Expedient and preferred embodiments of the method according to the present invention have further been given the characterizing features as set forth in the appended subclaims.

DESCRIPTION OF PREFERRED EMBODIMENT

According to the invention, it has proved possible to produce, by means of per se known technology such as blow moulding, a package of plastic which is provided, in a simple manner and by similarly known vacuum deposition techniques, with an inner coating of a silicon oxide compound which bonds with good adhesive strength to the inner walls of the package for forming a thin, continuous silicon oxide coating which imparts to the package its desired barrier properties. Since the barrier properties of the package are, in practice, entirely catered for by the thus applied silicon oxide coating and not by the selected plastic (as is the case in prior art technology), the selection of plastics for the package according to the invention will be relatively freely optional and uncritical, and not restricted to such a degree as before to plastics of special types and qualities, such as barrier polymers. Thus, according to the invention, a plastic of cheaper quality and nature than the above-mentioned barrier polymers may be selected, on condition that the selected plastic is of sufficient mechanical strength and configurational rigidity to make the package convenient to handle.

The expression "vacuum deposition" is here taken to signify conventional coating processes such as plasma deposition, chemical plasma vapour deposition (abbreviated to CPVD), sputtering etc., which all constitute well-known examples of such processes.

According to one preferred embodiment of the method of the invention, the silicon oxide coating is applied using chemical plasma vapour deposition (CPVD) by means of which it is possible to achieve an extremely thin, but nevertheless very tight coating of a silicon oxide compound of the general chemical formula $SiO_x$, where x may vary from between 1,8 and 2,2 and which, in addition to excellent gas and aroma barrier properties, also possesses the favourable property that it does not absorb or otherwise take up the flavour and aromatic substances which may occur in certain types of products which are to be packed. Such so-called non-scalping properties are particularly valuable in connection with products of the citrus fruit juice type in which flavour and aromatic substances are present in abundance.

The thickness of the applied silicon oxide coating on the inner walls of the package must be very thin and is less than 2000 Å, depending upon the product which is to be packed. If the product is less gas-sensitive, coating thicknesses down to 100 Å or less are fully sufficient, while more gas-sensitive products require greater coating thicknesses which increase at the same rate as the gas sensitivity of the product, and approach 2000 Å which is the upper limit for a package according to the invention.

Since the coating thickness is relatively easy to control by controlling the process parameters involved, the method according to the present invention makes for an easy switch from one coating thickness to another in such a manner as makes possible the production of packages possessing more or less "tailor made" properties.

As has been mentioned earlier, a plastic package according to the present invention may be produced by producing a preform by blow moulding using a gaseous forming medium. The blow-moulded preform (which may have but not necessarily has the shape of bottle) is then placed in a vacuum chamber arranged for chemical plasma vapour deposition (CPVD) to which chamber are fed the requisite reaction gases (oxygen gas and a vapourised organic silicon compound) in controlled mixing proportions to one another, together with inert gas, at the same time as an electric microwave field of a given force and frequency is established within the vacuum chamber, for forming a plasma. By pressure reduction beneath a critical pressure, the plasma is ignited whereupon chemical reactants included in the plasma react with one another and are deposited on the inner walls of the preform for forming a progressively growing coating of a silicon oxide compound of the general chemical formula $SiO_x$, where x may vary from between 1,8 to 2,2 depending on the mixing ratio between the reaction gases employed. When the desired coating thickness has been achieved, the process is discontinued.

According to one particularly preferred embodiment of the method of the present invention, the blow moulding stage is combined with the subsequent chemical deposition stage in such a manner that the process gas intended for the coating (i.e. oxygen gas, vapourised organic silicon compound and inert gas) is also employed in the preceding blow moulding stage as the gaseous medium for producing the blow-moulded preform, in which event the thus blow-moulded preform is suitably sealed with the employed process gas enclosed in the preform for the subsequent chemical plasma vapour deposition in the vacuum chamber.

The present invention will be described and explained in greater detail hereinbelow with the aid of one embodiment, cited exclusively for purposes of exemplification, of how the method according a preferred embodiment of the present invention may be reduced into practice for producing a package possessing superior barrier properties in respect of gases, in particular superior oxygen gas barrier properties. Thus, the selected embodiment should not be perceived or interpreted as restrictive of the scope of the present invention which, within the spirit and scope of the general description and the appended claims, also encompasses modifications and variations obvious to a person skilled in the art, even if such are not explicitly mentioned in the embodiment described below.

In a first stage, a package of plastic (eg. polyester, polycarbonate, polypropylene, polyethylene, polyamide or polyethylene naphthenate) is produced in the form of, for example, a bottle in accordance with conventional blow moulding technology, employing gaseous medium which, under pressure, forms a plastic blank following the contours of a bottle shaped mould cavity between two movable mould halves. As gaseous medium, use is preferably made of a process gas of the same type as that which is to be employed in a subsequent coating stage in order to coat the inner walls of the blow-moulded plastic bottle with a thin coating in accordance with conventional chemical plasma vapour deposition technology (CPVD), as will be described in greater detail hereinbelow. In this preferred embodiment, the selected process gas consists of a mixture of oxygen gas, vapourised organic silicon compound (eg. tetramethyl disiloxane) and an inert gas (eg. helium) in a predetermined mutual mixing ratio with one another in order, under selected process conditions, to form, in subsequent coating stages, the desired coating on the inner walls of the bottle. The blow-moulded bottle is thereafter sealed in a suitable manner, while still containing the above-mentioned process gas employed as gaseous blowing medium, for a subsequent process stage.

The blow-moulded, closed plastic bottle with enclosed process gas is then transported, possibly after an intermediate storage time, to, e.g., vacuum chamber for the above-mentioned coating stage where the bottle is first opened or penetrated by means of a suitable penetration agent in a controlled way for creating a communication or hole through the applied bottle closure, at the same time as the ambient atmosphere surrounding the bottle is attenuated by a vacuum pump (i.e., the ambient pressure is reduced below a predetermined critical pressure), by means of which the pressure of the enclosed process gas in the bottle is set at a specific level for plasma discharge. The bottle is thereafter inserted into a process chamber arranged for chemical plasma vapour deposition where a plasma is ignited by means of an electric microwave field of predetermined force and frequency. The purpose of the plasma is twofold. First, the process gas molecules are excited by the energy present in the plasma so as to create a coating of the desired silicon oxide compound which is incremental on the inner walls of the bottle, and secondly, since plasma has oxidative properties, the inner walls of the bottle are simultaneously cleaned to sterile state with the result that the bottle becomes interiorly sterile at the same time as obtaining, through the thus formed silicon oxide coating, barrier properties against gas and aroma migration through the walls of the bottle.

As has been mentioned previously, the composition of the thus formed silicon oxide coating, as well as its thickness can be controlled by adjustment of the composition of the process gas and the duration of the chemical plasma deposition coating process in the process chamber, respectively. In this embodiment, the composition of the process gas employed in respect of included chemically reacting gases (oxygen gas and vapourised organic silicon compound) is adjusted such that the coating produced consists of a silicon oxide compound of the general chemical formula $SiO_x$, where x may vary from between 1,8 to 2,2, which has proved to be the optimum composition range for the coating. Furthermore, the thickness of the coating may be varied, in which event the process is discontinued when the coating has reached a thickness of less than 2000 Å, which gives the finished bottle its desired barrier properties.

While the interiorly coated bottle is still interiorly sterile, the bottle is introduced into a subsequent sterile chamber where the previously only partially penetrated bottle closure is given suitable design for later aseptic sealing, whereafter the bottle is interiorly flushed or rinsed with sterile air. Finally, the bottle is filled with the pertinent product and is aseptically sealed for further transport to a retail outlet or place of consumption for the product.

As is apparent from the foregoing description, the present invention realizes a simple, efficient method for producing a package, for example a bottle, possessing superior barrier properties against gases and aroma substances, employing an advantageous combination of per se known technologies. A particularly valuable advantage afforded by the method according to the present invention is, as has been pointed out previously, that the thus produced package is also given, in addition to superior barrier properties, an interior sterility which may advantageously be utilized in aseptic packing of a product.

What is claimed is:

1. A method of producing an interiorly sterile package possessing superior barrier properties, in which method a package is produced from plastic by blow moulding using gaseous blow moulding medium, whereafter the blow moulded package is provided on its inner walls with a coating, serving as barrier, and consisting of a silicon compound by vacuum deposition, wherein a gaseous medium employed for blow moulding the package is also employed as process gas in a vacuum deposition process for forming the coating on the inner walls of the package.

2. The method as claimed in claim 1, wherein the vacuum deposition is carried out in accordance with chemical plasma vapour deposition (CPVD), the process parameters involved being controlled in such a manner that the thus produced coating consists of a silicon oxide of the general chemical formula $SiO_x$, where x may vary from between 1,8 to 2,2.

3. The method as claimed in claim 1, wherein a gas mixture containing oxygen gas and vapourised silicon compound is used as the gaseous blow moulding medium and as the process gas.

4. The method as claimed in claim 1, wherein the blow moulded package is, after vacuum deposition, filled with a product under aseptic conditions.

5. The method as claimed in claim 1, wherein the blow moulded package is sealed while it still contains the gaseous blow moulding medium and is placed in a vacuum chamber arranged for chemical plasma vapour deposition, the sealing or closure of the package being penetrated during simultaneous reduction of the ambient pressure surrounding the package below a predetermined critical pressure at which formed plasma is ignited by an electric microwave field of predetermined force and frequency established in the chamber.

6. A method of producing an interiorly sterile package possessing superior barrier properties, comprising:

(a) applying a gaseous medium under pressure to a plastic blank, thereby blow-molding the plastic into a package preform; and (b) subjecting the gaseous medium in the package preform to chemical plasma vapor deposition conditions, such that reaction gas molecules in the gaseous medium react to deposit a coating of $SiO_x$, wherein x lies in a range of about 1.8–2.2, on inner walls of the package preform.

7. The method according to claim 6, further comprising sealing and storing the blow-molded package preform prior to step (b).

8. The method according to claim 7, further comprising transporting the sealed package preform to a vacuum chamber prior to step (b), and forming an opening in the sealed package preform simultaneously with step (b).

9. The method according to claim 6, wherein the gaseous medium comprises oxygen gas, a vaporized organic silicon compound, and an inert gas.

10. The method according to claim 6, wherein the gaseous medium comprises oxygen gas, vaporized tetramethyl disiloxane, and helium.

11. The method according to claim 6, wherein step (b) comprises reducing ambient pressure surrounding the package preform, by vacuum pump, to a critical pressure level specific for plasma discharge, and applying an electric microwave field of predetermined force and frequency to ignite a plasma.

12. The method according to claim 11, wherein the plasma energizes the reaction gas molecules to react so as to deposit the $SiO_x$ coating, and simultaneously sterilizes an interior of the package preform.

13. The method according to claim 6, wherein the $SiO_x$ coating is deposited to a thickness of about 2000 Å or less.

14. The method according to claim 6, wherein the $SiO_x$ coating is deposited to a thickness of about 100 Å or less.

15. The method according to claim 6, wherein the plastic is polyester, polycarbonate, polypropylene, polyethylene, polyamide or polyethylene naphthenate.

16. The method according to claim 6, further comprising after step (b):

(c) shaping the $SiO_x$-coated package preform into a package;

(d) filling the package with a product; and (e) sealing the filled package under aseptic conditions.

17. The method according to claim 6, further comprising after step (b):

(c) introducing the $SiO_x$-coated package preform into a sterile chamber;

(d) shaping the $SiO_x$-coated package preform into a package suitable for later aseptic sealing;

(e) flushing an interior of the package with sterile air; and (f) filling the $SiO_x$-coated package with a product and sealing the filled package under aseptic conditions.

18. A method of producing an interiorly sterile package possessing superior barrier properties, comprising:

(a) applying a gaseous medium under pressure to a plastic blank, thereby blow-molding the plastic into a package preform;

(b) sealing the package preform while it contains the gaseous medium; and (c) forming an opening in the sealed package preform while simultaneously subjecting the package preform to chemical plasma vapor deposition conditions, such that reaction gas molecules in the gaseous medium contained in the package react to deposit a coating of $SiO_x$, wherein x lies in a range of about 1.8–2.2, on inner walls of the package, in a thickness of about 2000 Å or less.

19. The method according to claim 18, wherein step (c) comprises reducing ambient pressure surrounding the package preform, by vacuum pump, to a critical pressure level specific for plasma discharge, and applying an electric microwave field of predetermined force and frequency to ignite a plasma.

20. The method according to claim 19, wherein the plasma energizes the reaction gas molecules to react so as to produce the $SiO_x$ coating, and simultaneously sterilizes an interior of the package preform.

* * * * *